US006867984B2

(12) United States Patent
Chen

(10) Patent No.: US 6,867,984 B2
(45) Date of Patent: Mar. 15, 2005

(54) RESILIENT CONTACT ELEMENT

(75) Inventor: Wei-Chen Chen, Taipei (TW)

(73) Assignee: Emi Stop Corporation, Taipei (TW)

(*) Notice: Subject to any disclaimer, the term of this patent is extended or adjusted under 35 U.S.C. 154(b) by 0 days.

(21) Appl. No.: 10/669,534

(22) Filed: Sep. 24, 2003

(65) Prior Publication Data

US 2004/0062017 A1 Apr. 1, 2004

(30) Foreign Application Priority Data

Sep. 27, 2002 (TW) ........................................ 091215355

(51) Int. Cl.[7] ........................... H05K 1/14; H01R 13/24

(52) U.S. Cl. ........................ 361/804; 361/742; 361/758; 361/770; 439/65; 439/66

(58) Field of Search ................................. 361/742, 758, 361/770, 804, 735, 810, 807, 808, 796, 809, 803; 174/138 E, 138 G; 439/65, 66, 91, 591, 30

(56) References Cited

U.S. PATENT DOCUMENTS 3,842,189 A * 10/1974 Southgate .................. 174/52.3
4,553,192 A * 11/1985 Babuka et al. .............. 361/743
5,092,783 A * 3/1992 Suarez et al. ................. 439/71
5,139,427 A * 8/1992 Boyd et al. .................... 439/66
5,655,913 A * 8/1997 Castaneda et al. ............ 439/66
5,984,697 A * 11/1999 Moran et al. ................. 439/92
6,305,948 B1 * 10/2001 Wu ............................. 439/66

* cited by examiner

*Primary Examiner*—Kamand Cuneo
*Assistant Examiner*—Dameon E. Levi
(74) *Attorney, Agent, or Firm*—Ohlandt, Greeley, Ruggiero & Perle, LLP

(57) ABSTRACT

A resilient contact element includes a unitary conductive contact strip that has a strip axis and that is configured with a mounting section, a curved section, a resilient section and a contact section. The mounting section is to be disposed on a mounting plane, and has opposite front and rear end portions along the strip axis. The curved section includes a first curved segment that curves rearwardly from the rear end portion away from the mounting plane, and a second curved segment that curves rearwardly from the first curved segment toward the mounting plane. The resilient section curves forwardly from the second curved segment away from the mounting plane, and has a first end connected to the second curved segment, and an opposite second end. The contact section extends forwardly from the second end of the resilient section, and is generally parallel to the mounting section.

11 Claims, 3 Drawing Sheets

RESILIENT CONTACT ELEMENT

CROSS-REFERENCE TO RELATED APPLICATION

This application claims priority of Taiwanese application no. 091215355, filed on Sep. 27, 2002.

BACKGROUND OF THE INVENTION

1. Field of the Invention

The invention relates to a resilient contact element, more particularly to a resilient contact element that has a durable construction.

2. Description of the Related Art

The resilient contact elements commonly used in the industry are usually made of a bent unitary conductive contact strip, and are mounted fixedly on a surface of a circuit board using known surface-mounting techniques (SMT). By virtue of inherent resilience attributed to the material and construction of the resilient contact elements, the resilient contact elements can be used in electrical connections, grounding, electromagnetic interference (EMI) shielding, etc., between an electric component and the circuit board, or simply as a buffer during contact therebetween.

As shown in FIGS. 1 and 2, a conventional resilient contact element 4 is configured with a mounting section 41, a resilient section 42, and a contact section 43. The mounting section 41 is elongate, and is fixed on a surface of a circuit board 5 using surface-mounting techniques. The resilient section 42 extends from one end of the mounting section 41, and is bent toward the free end of the mounting section 41 to form a semicircular curve. The contact section 43 extends from the other end of the resilient section 42, and is generally parallel to and spaced apart from the mounting section 41. The contact section 43 thus cooperates with the mounting section 41 to form a compressible space therebetween. Accordingly, an electric component, such as an antenna 6, can contact the contact section 43 to establish electrical connection with the circuit boards.

Due to the current trend toward miniaturization of electronic products, the height of the contact section 43 relative to the surface of the circuit board 5 is required to be as small as possible in order to reduce the thickness of electronic products. While the compressible space between the contact section 43 and the mounting section 41 is reduced, the reduction should not be too much in order to maintain the contact capability between the electric component 6 and the contact section 43. Particularly, it is important to ensure that the resilient section 42 can be restored to a proper initial state upon removal of the electric component 6 and that the resilient contact element 4 can be prevented from experiencing permanent deformation. According to actual experiments, for instance, when the thickness of the material of the resilient contact element 4 is 0.08 mm, the smallest curve radius of the resilient section 42 when the resilient contact element 4 is contacted by the electric component 6 is required to be at least five times the thickness of the resilient contact element 4, i.e., 0.4 mm, in order to avoid permanent deformation at the resilient section 42 and eventual damage to the resilient contact element 4. As such, the compressible space between the mounting section 41 and the contact section 43 of the resilient contact element 4 is required to be at least 0.8 mm when the resilient contact element 4 is contacted by the electric component 6 so as to ensure that the resilient section 42 can be restored to the proper initial state.

On the other hand, the distance between the electric component 6 and the circuit board 5 cannot always be precisely controlled to be 0.8 mm. Therefore, on occasions where the distance between the electric component 6 and the circuit board 5 is smaller than 0.8 mm, permanent deformation of the resilient section 42 can occur. Moreover, since the resilient contact element 4 is mounted inside an electronic device, damage to the resilient contact element 4 cannot be detected externally of the electronic device. As a result, poor contact with the electric component 6 at the contact section 43 will be unavoidable in view of the deformed resilient section 42.

It is apparent from the foregoing that the compressible space in the conventional resilient contact element 4 cannot be reduced further due to restrictions imposed by the construction of the contact element 4. Furthermore, when the compressible space is reduced to the lowest permissible limit, the reliability of the resilient contact element 4 is affected adversely.

SUMMARY OF THE INVENTION

Therefore, the object of the present invention is to provide a resilient contact element that has a stable, durable and reliable construction while having a reduced height relative to a mounting plane.

Accordingly, a resilient contact element of the present invention comprises a unitary conductive contact strip that has a strip axis and that is bent to configure the contact strip with an elongate mounting section, a curved section, a resilient section, and an elongate contact section.

The mounting section is to be disposed on a mounting plane, and has a front end portion and a rear end portion opposite to the front end portion along the strip axis The curved section has a concave configuration relative to the mounting plane, and includes a first curved segment that curves rearwardly from the rear end portion away from the mounting plane, and a second curved segment that curves rearwardly from the first curved segment toward the mounting plane. The resilient section curves forwardly from the second curved segment away from the mounting plane, and has a first end connected to the second curved segment, and a second end opposite to the first end along the strip axis. The contact section extends forwardly from the second end of the resilient section, and is generally parallel to and spaced apart from the mounting section.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
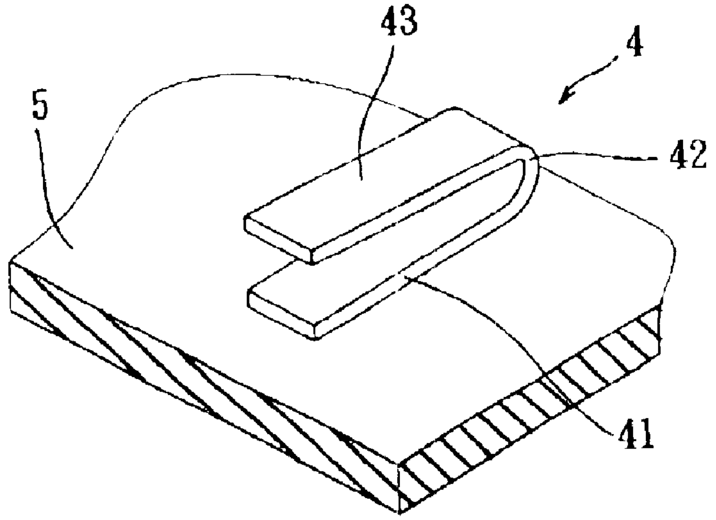
F I G. 1 PRIOR ART
FIG. 1 is a perspective view of a conventional resilient contact element that is mounted on a circuit board.
Figure 2:
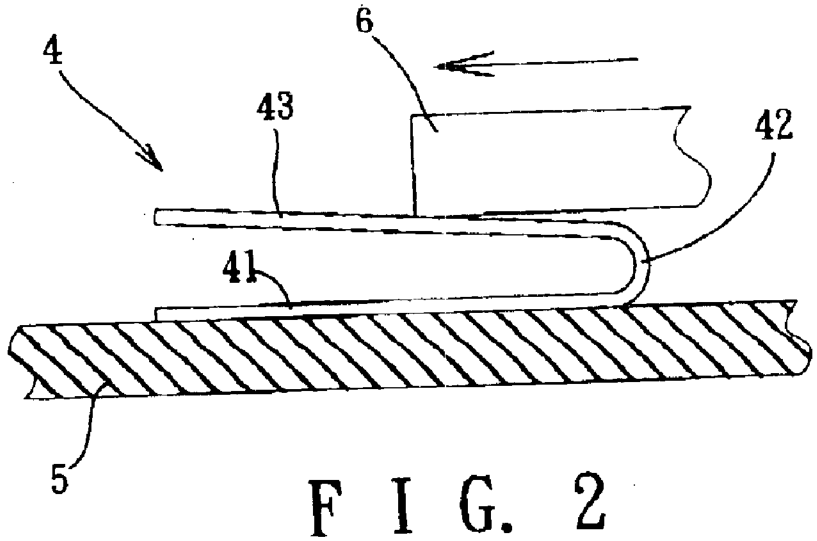
F I G. 2 PRIOR ART
FIG. 2 is a schematic side view of the conventional resilient contact element of FIG. 1.
Figure 3:
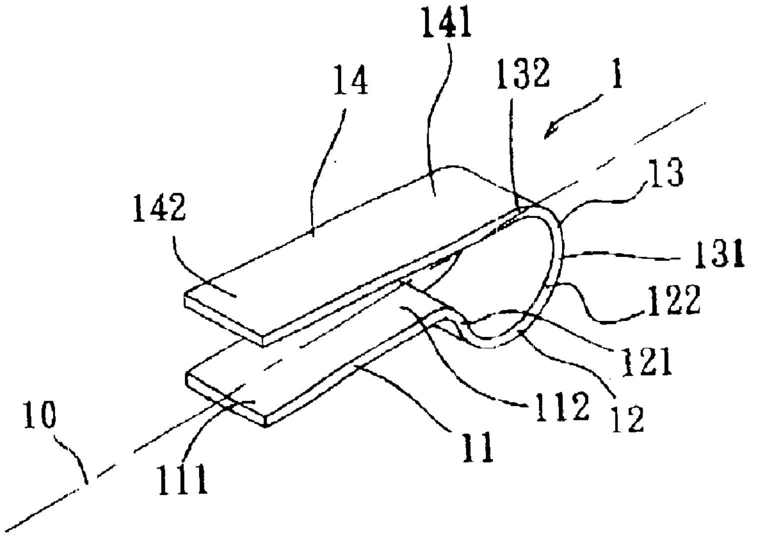
FIG. 3 is a perspective view of the first preferred embodiment of a resilient contact element according to the present invention.
Figure 4:
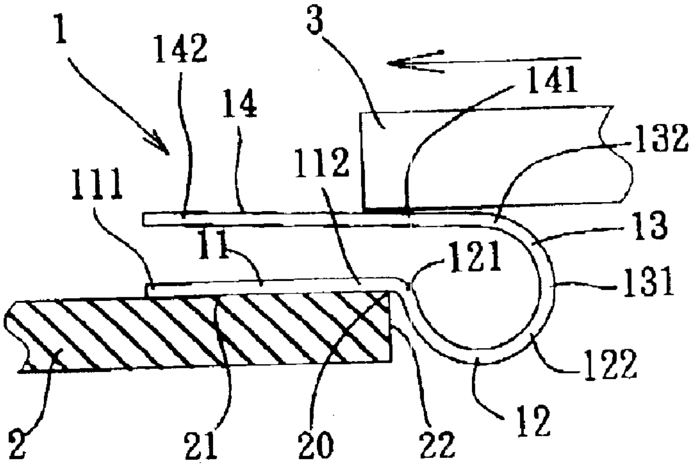
FIG. 4 is a schematic side view illustrating an application of the first preferred embodiment.
Figure 5:
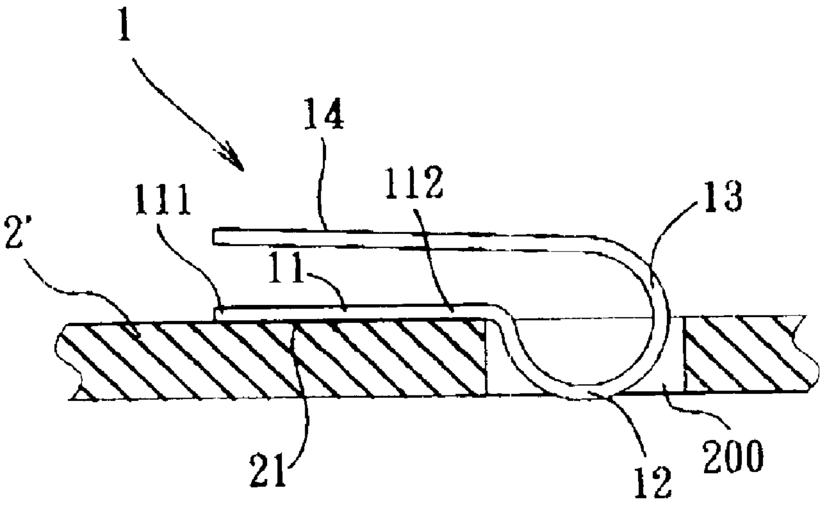
FIG. 5 is a schematic side view illustrating another application of the first preferred embodiment.

Referring to FIGS. 3, 4 and 5, the first preferred embodiment of a resilient contact element 1 according to the present invention is shown to be adapted to be mounted on an edge portion 20 of a circuit board 2 and is used to establish electrical connection between the circuit board 2 and an electric component 3, such as an antenna. The circuit board 2 has a top side 21 that serves as a mounting plane, and a vertical edge 22 that is transverse to the top side 21. The resilient contact element 1 comprises a unitary conductive contact strip that has a strip axis 10 and that is bent to configure the contact strip with an elongate mounting section 11, a curved section 12, a resilient section 13, and a contact section 14.

The mounting section 11 is to be disposed on the top side 21 of the circuit board 2, and is fixed thereon using known surface-mounting techniques. The mounting section 11 has a front end portion 111 and a rear end portion 112 opposite to the front end portion 111 along the strip axis 10.

The curved section 12 has a concave configuration relative to the top side 21 of the circuit board 2, and includes a first curved segment 121 that curves rearwardly from the rear end portion 112 away from the top side 21 of the circuit board 2, and a second curved segment 122 that curves rearwardly from the first curved segment 121 toward the top side 21 of the circuit board 2. The curved section 12 is to be disposed rearwardly of the vertical edge 22 of the circuit board 2.

The resilient section 13 curves forwardly from the second curved segment 122 away from the top side 21 of the circuit board 2, and has a first end 131 connected to the second curved segment 122, and a second end 132 opposite to the first end 131 along the strip axis 10. In this embodiment, the resilient section 13 and the curved section 12 cooperate to form a contour that is shaped as three-quarters of a circle.

The contact section 14 extends forwardly from the second end 132 of the resilient section 13, and is generally parallel to and spaced apart from the mounting section 11. The contact section 14 has a connecting portion 141 connected to the resilient section 13, and a distal portion 142 opposite to the connecting portion 141 along the strip axis 10. In this embodiment, the contact section 14 has a length corresponding to that of the mounting section 11.

In use, since the curved portion 12 is disposed adjacent the vertical edge 22 of the circuit board 2, and since the compressible space is augmented by the thickness of the circuit board 2, the dimensions of the compressible space between the mounting section 11 and the contact section 14 are no longer restricted by the curvature of the resilient section 13 and can be reduced further so as to reduce the height of the contact section 14 relative to the circuit board 2 to a minimum. Furthermore, the resilient section 13 of this invention has the advantage of being less susceptible to permanent deformation such that the stability, durability and reliability of the resilient contact element 1 are enhanced accordingly.

As shown in FIG. 5, in another application of the resilient contact element 1 of the first preferred embodiment, the mounting section 11 is fixed on the top side 21 of the circuit board 2' such that the curved section 12 is received in a hole 200 in the circuit board 2'. The aforesaid effects and advantages are similarly achieved in the application of FIG. 5.

Figure 6:
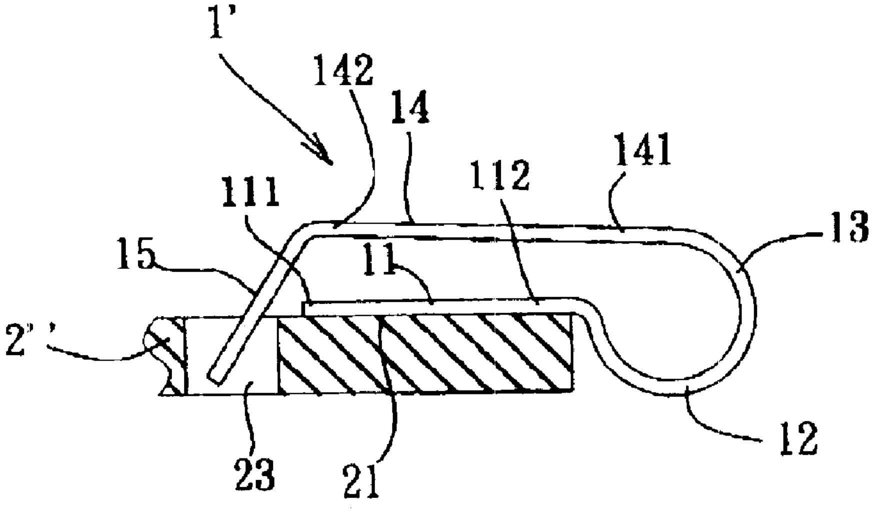
FIG. 6 is a schematic side view of the second preferred embodiment of a resilient contact element according to the present invention.

FIG. 6 illustrates the second preferred embodiment of the resilient contact element 1' of this invention to be further configured with a blocking section 15 that extends inclinedly from the distal portion 142 of the contact section 14 toward the top side 21 of the circuit board 2", and that is disposed in front of the front end portion 111 of the mounting section 11. Preferably, the blocking section 15 has a length sufficient to extend beyond the top side 21 of the circuit board 2", i.e., into a hole 23 in the circuit board 2", so as to block an open side of the compressible space between the mounting section 11 and the contact section 14. The purpose of the blocking section 15 is to prevent the electric component 3 (see FIG. 4) from hooking with the contact section 14 when removing the electric component 3, which can damage the resilient contact element 1', and to prevent foreign objects from extending between the mounting section 11 and the contact section 14 and interfering with contact operation of the contact section 14.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A resilient contact element comprising a unitary conductive contact strip that has a strip axis and that is bent to configure said contact strip with an elongate mounting section to be disposed on a mounting plane, said mounting section having a front end portion and a rear end portion opposite to said front end portion along the strip axis, a curved section having a concave configuration relative to the mounting plane, and including a first curved segment that curves rearwardly from said rear end portion away from the mounting plane, and a second curved segment that curves rearwardly from said first curved segment toward the mounting plane, a resilient section that curves fowardly from said second curved segment away from the mounting plane, said resilient section having a first end connected to said second curved segment, and a second end opposite to said first end along the strip axis, and an elongate contact section extending forwardly from said second end of said resilient section and generally parallel to and spaced apart from said mounting section.

2. The resilient contact element as claimed in claim 1, wherein said contact section has a connecting portion connected to said resilient section, and a distal portion opposite to said connecting portion along the strip axis, said contact strip being further configured with a blocking section that extends inclinedly from said distal portion of said contact section toward the mounting plane, and that is disposed in front of said front end portion of said mounting section.

3. The resilient contact element as claimed in claim 2, wherein said blocking section has a length sufficient to extend beyond the mounting plane.

4. The resilient contact element as claimed in claim 1, wherein said resilient section and said curved section cooperate to form a contour that is shaped as three-quarters of a circle.

5. A resilient contact element comprising a unitary conductive contact strip that has a strip axis and that is bent to configure said contact strip with an elongate mounting section to be disposed on a mounting plane, said mounting section having a front end portion and a rear end portion opposite to said front end portion along the strip axis, a curved section having a concave configuration relative to the mounting plane, and including a first curved segment that curves rearwardly from said rear end portion away from the mounting plane, and a second curved segment that curves rearwardly from said first curved segment toward the mounting plane, a resilient section that curves fowardly from said second curved segment away from the mounting plane, said resilient section having a first end connected to said second curved segment, and a second end opposite to said first end along the strip axis, an elongate contact section extending forwardly from said second end of said resilient section and generally parallel to and spaced apart from said mounting section, and a blocking section that extends inclinedly from said distal portion of said contact section toward the mounting plane, that is disposed in front of said front end portion of said mounting section, and that has a length sufficient to extend beyond the mounting plane.

6. The resilient contact element as claimed in claim 5, wherein said resilient section and said curved section cooperate to form a contour that is shaped as three-quarters of a circle.

7. A board assembly comprising:

a circuit board having a mounting plane and an edge transverse to said mounting plane; and a resilient contact element including a unitary conductive contact strip that has a strip axis and that is bent to configure said contact strip with an elongate mounting section mounted on said mounting plane, said mounting section having a front end portion and a rear end portion opposite to said front end portion along the strip axis, a curved section having a concave configuration relative to the mounting plane, and including a first curved segment that curves rearwardly from said rear end portion away from the mounting plane, and a second curved segment that curves rearwardly from said first curved segment toward the mounting plane, a resilient section that curves fowardly from said second curved segment away from the mounting plane, said resilient section having a first end connected to said second curved segment, and a second end opposite to said first end along the strip axis, and an elongate contact section extending forwardly from said second end of said resilient section and generally parallel to and spaced apart from said mounting section.

8. The board assembly as claimed in claim 7, wherein said edge defines a hole in said circuit board, said curved section being disposed in said hole in said circuit board.

9. The board assembly as claimed in claim 7, wherein said contact section has a connecting portion connected to said resilient section, and a distal portion opposite to said connecting portion along the strip axis, said contact strip being further configured with a blocking section that extends inclinedly from said distal portion of said contact section toward said mounting plane, and that is disposed in front of said front end portion of said mounting section.

10. The board assembly as claimed in claim 9, wherein said circuit board is formed with a hole proximate to said front end portion of said mounting section, said blocking section having a length sufficient to extend into said hole.

11. The resilient contact element as claimed in claim 1, wherein said resilient section and said curved section cooperate to form a contour that is shaped as three-quarters of a circle.

* * * * *